United States Patent [19]
Thiel

[11] Patent Number: 6,084,395
[45] Date of Patent: Jul. 4, 2000

[54] STACKABLE PLASTIC COVER FOR USE ON ELECTRICAL METERS

[75] Inventor: Patrick L. Thiel, Raleigh, N.C.

[73] Assignee: ABB Power T&D Company Inc., Raleigh, N.C.

[21] Appl. No.: 09/104,071

[22] Filed: Jun. 24, 1998

[51] Int. Cl.[7] ...................................................... G01R 1/04
[52] U.S. Cl. ........................ 324/156; 324/157; 220/4.26; 206/505
[58] Field of Search ..................................... 324/156, 157; 206/503, 505, 516, 508; 220/4.22, 4.26, 669; 361/659, 664, 667

[56] References Cited

U.S. PATENT DOCUMENTS 5,499,715  3/1996  Nemeth ................................... 206/505
5,852,901  12/1998  Meyers ......................................... 52/20

FOREIGN PATENT DOCUMENTS 2255800  12/1973  France .

*Primary Examiner*—Jay Patidar
*Attorney, Agent, or Firm*—Woodcock Washburn Kurtz Mackiewicz & Norris LLP

[57] ABSTRACT

The stackable plastic cover allows a series of covers to be stacked into a column. This is achieved by increasing the sidewall taper to allow the inside of one cover to nest down over the outside of the adjacent cover. Conical projections on the outside of the tapered wall surface provide a stop for the adjacent cover to rest upon and additional conical projections are placed above the stops to prevent scratching of the covers and wall sections.

4 Claims, 3 Drawing Sheets

STACKABLE PLASTIC COVER FOR USE ON ELECTRICAL METERS

BACKGROUND OF THE INVENTION

This invention relates to stackable plastic covers which allow a series of the covers to be stacked into a column and particularly to a stackable plastic cover for electric meter bases.

Electric meters, for many years, have used glass covers in the shape of a dome with a weld-on stainless steel rim to secure them to the meter base. The use of a plastic cover began about fifteen years ago and its design has remain basically unchanged since its inception. The prior art cover is molded from a clear high strength polycarbonate material and is designed to be of one piece construction. This is in contrast to the glass covers with their weld-on stainless steel rim. The shape of the plastic cover was patterned off the glass cover and stainless steel rim where the interior space was sized to fit over the internal meter components and the exterior height and. diameter of the flange were constrained to match with the mating sealing ring. In the original design of the prior art plastic cover, little attention was given to (1) the volume or envelope of the cover and the associated cost related to handling and shipping of the part, (2) interchangeability with all competitive meter bases and (3) minimizing the cost of manufacturing by a shorter mold cycle time and reduced weight of polycarbonate material. It was also a problem with the prior art covers to store a supply of the covers while they were waiting to be assembled with the meter bases since the covers were not designed, for nesting.

SUMMARY OF THE INVENTION

It is an object of the present invention to provide a cover which is stackable, has a broad range of applicability for replacement covers and costs less to manufacture.

In accordance with the present invention there is provided a stackable plastic cover constructed to allow a series of covers to be stacked into a column. The stackable plastic cover includes a tapered conical sidewall having a central axis, a closed circular top and an open circular bottom and an annular flange projecting outwardly from the conical sidewall adjacent the open circular bottom. A plurality of stop members project outwardly from and are arranged around the periphery of the tapered conical sidewall at a predetermined distance above the annular flange. A plurality of tapered ribs corresponding to the plurality of stop members is aligned with the stop members and extend there above along the surface and axially of the taped conical sidewall whereby the stop members provide a stop for the annular flange of an adjacent cover in the column to rest upon and spaced from the first named annular flange a distance determined by the predetermined distance, whereby the ribs guide the adjacent cover into engagement with the stop members so as to prevent scratching of the sidewalls of the covers. In accordance with a further aspect of the invention each of the plurality of stop members has the configuration of a longitudinal segment of an inverted conical shaped projection, the inverted conical shaped projection having a flat base portion projecting outwardly from the periphery of the tapered conical sidewall and substantially perpendicular to the central axis of the conical sidewall. In accordance with a further aspect of the invention, each of the plurality of tapered ribs has a configuration of a longitudinal segment of a conical projection and smaller than the inverted conical projection.

DETAILED DESCRIPTION OF THE PREFERRED EMBODIMENT

Figure 1:
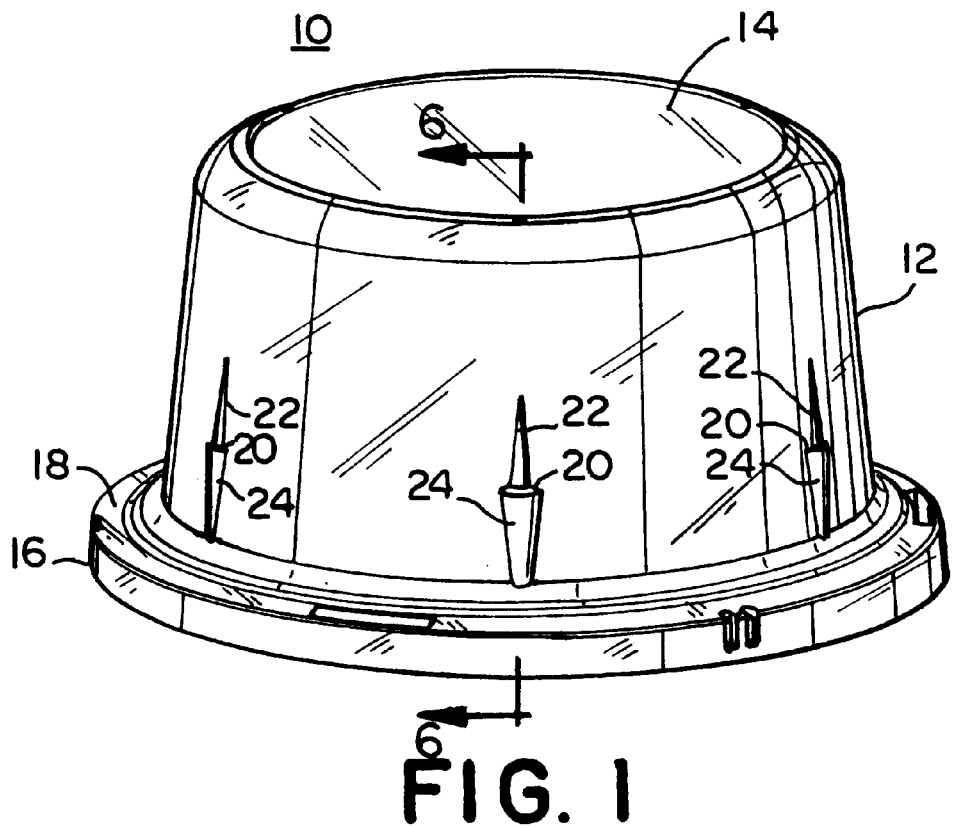
FIG. 1 is a perspective view of a stackable plastic cover embodying the present invention.
Figure 2:
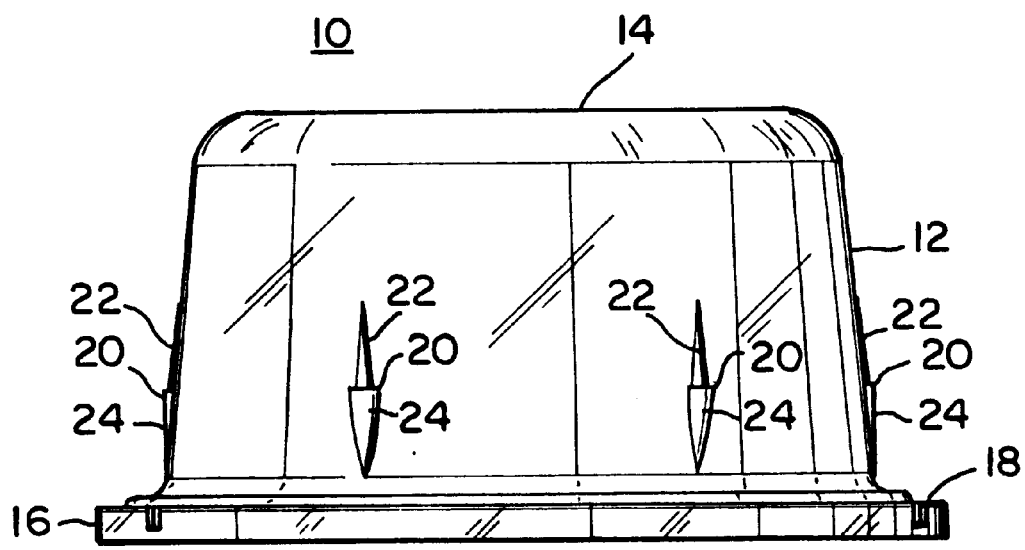
FIG. 2 is a side elevation view of the stackable plastic cover shown in FIG. 1.
Figure 3:
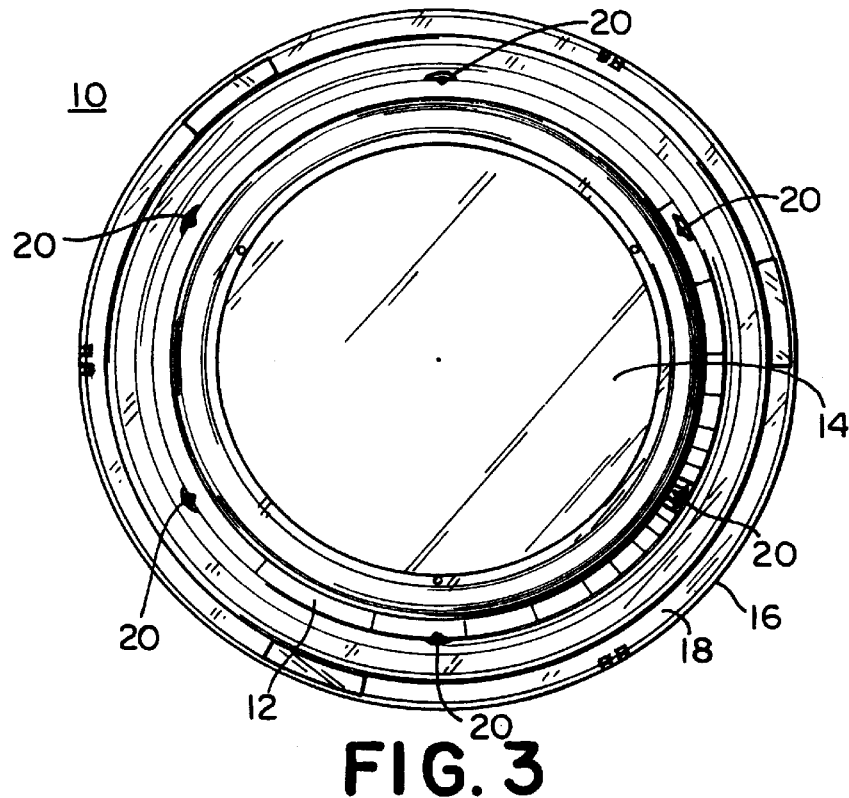
FIG. 3 is a top plan view of the stackable plastic cover shown in FIG. 1.
Figure 4:
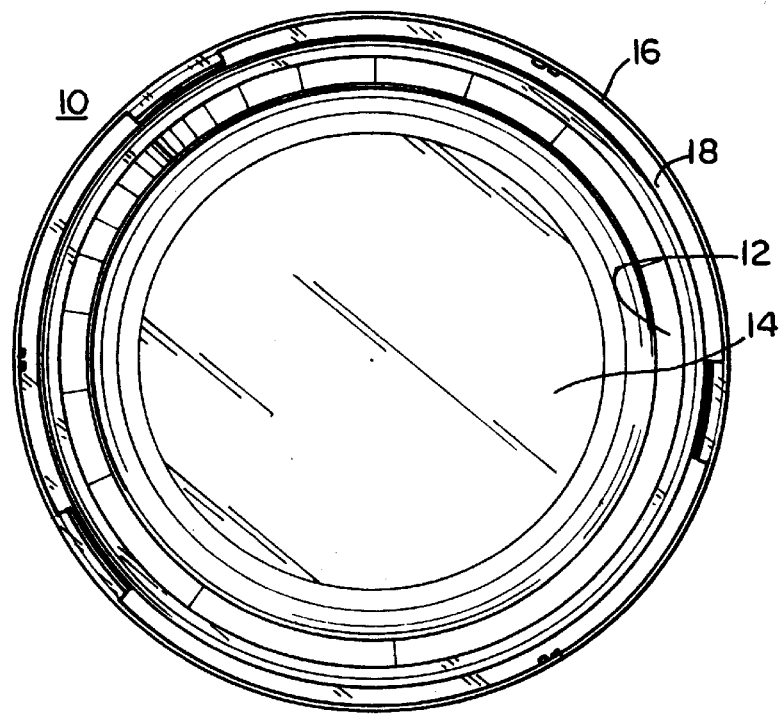
FIG. 4 is a bottom plan view of the stackable plastic cover shown in FIG. 1.
Figure 5:
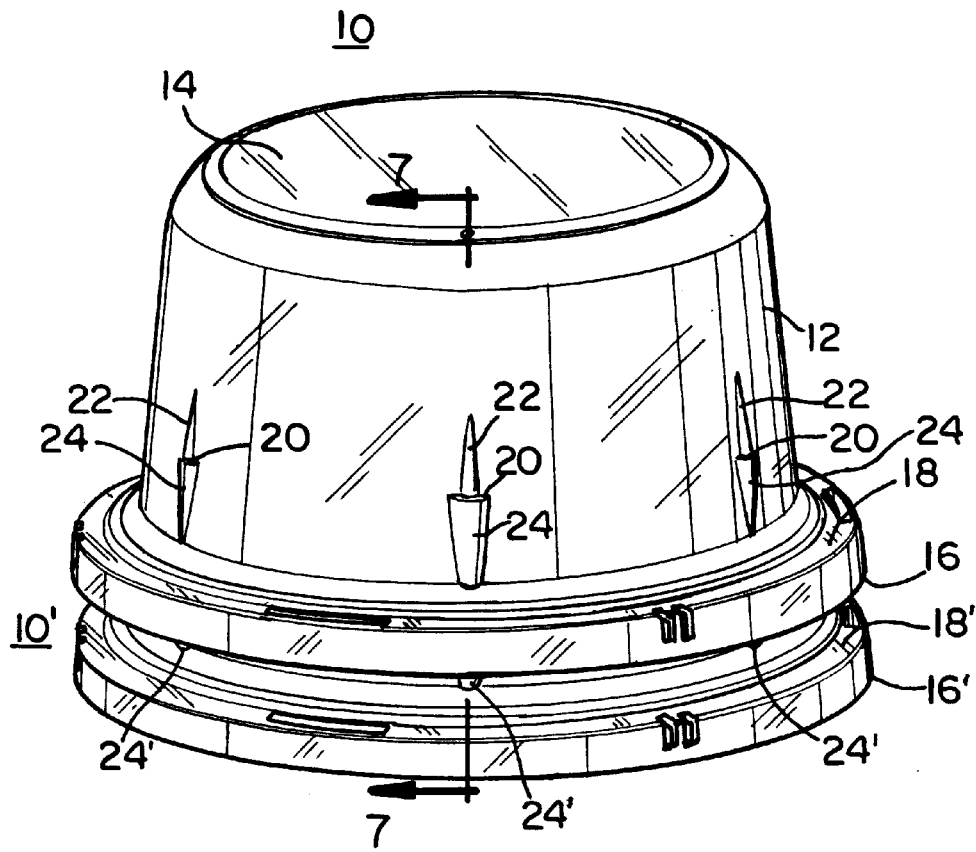
FIG. 5 is a perspective view showing two covers embodying the present invention in stacked position.
Figure 6:
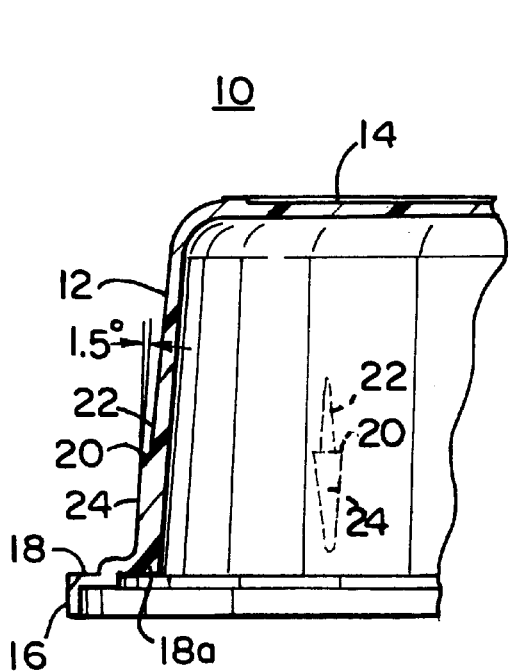
FIG. 6 is a fractional sectional view taken along the lines 6—6 in FIG. 1.
Figure 7:
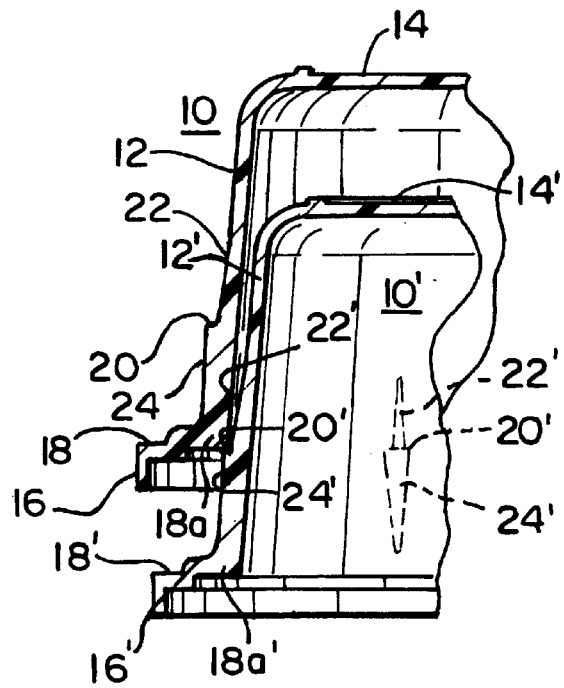
FIG. 7 is a fractional sectional view taken along the lines 7—7 in FIG. 5.

Referring to FIGS. 1–5 there is illustrated a stackable plastic cover 10 embodying the present invention and constructed to allow a series of covers to be stacked into a column. Two of such covers 10 and 10' in stacked position are illustrated in FIG. 5. The lower cover 10' and its parts are identical with corresponding reference characters to those used in connection with cover 10. The stackable plastic cover 10 includes a taped conical sidewall 12 having a central axis, a closed circular top 14 and an open circular bottom 16. An annular flange 18 projects outwardly from the conical sidewall 12 adjacent the open circular bottom 16. A plurality of stop members 20, FIGS. 1, 2, 5 and 6 project outwardly from and are arranged around the periphery of the tapered conical sidewall 12 at a predetermined distance above the annular flange 18. A plurality of tapered ribs 22 corresponding to the plurality of stop members 20 are aligned with the stop members and extend there above along the surface and axially of the tapered conical sidewall 12. The stop members 20' on cover 10' provide a stop for portion 18a of the annular flange 18 of the adjacent cover 10 in the column as shown in FIG. 7, to rest upon and spaced from the annular flange 18 in the lower cover 10' a distance determined by the predetermined distance of the stops 20'. The ribs 22' guide the adjacent cover 10 into engagement with the stop members 20' on cover 10' so as to prevent scratching of the sidewalls of the adjacent covers.

In the preferred form of the invention the plurality of stop members 20 has the configuration of a longitudinal segment of an inverted conical shaped projection 24. The inverted conical shaped projection 24 has a flat base portion which forms the stop 20 and projects outwardly from the periphery of the tapered conical sidewall 12 and substantially perpendicular to the central axis of the conical sidewall. In one embodiment of the invention the base portion that forms the stop 20 projects from the surface about 0.068". The surface indicated at 24 in FIG. 6 was inclined toward the central axis of the conical sidewall 12 at an angle of about 1.5° from the vertical to permit the cover to be withdrawn from the mold. Each of the plurality of tapered ribs 22 preferably has a configuration of a longitudinal segment of a conical projection and is smaller than the inverted conical projection 24. The stackable plastic covers 10 and 10' preferably are molded from a clear high strength polycarbonate material.

To achieve stackability of the covers 10 and 10', the taper of the outside and inside walls 12, 12' were increased over the prior art covers. Existing dimensional constraints limited both the OD of the cover where the wall taper starts near the flange 18a as well as the ID at the top of the cover. A change in the taper was possible by reducing the wall thickness thereby allowing the covers to become nested. On the outside wall of the cover six conical shaped projections 24 were added to the exterior of the tapered wall 12 to form a ledge or stop 20 so the next cover could rest on it when the covers were stacked. Six additional projections 22 were added to the cover exterior above the stops 20 to prevent scratching of the covers when they are being stacked. A nearly uniform wall section thickness is incorporated into the cover walls and flange areas to improve the flow of molding material into the extremities of the part. Since wall section thicknesses were reduced, a corresponding weight reduction was realized along with a shortened molding process time cycle.

The stackable plastic cover 10, 10' of the present invention has following advantages over prior art covers. The increased taper of the cover sidewalls 12, 12' allow a cover 10 to slide over the top of an adjacent cover 10' until the flange 18*a* of the top cover 10 rests against the stop 20' of the cover 10' below it. The covers can be stacked into columns thereby increasing the density of packing up to fourfold. This contrasts with the existing method of placing covers in single layers, separated by dividers when palletized. The covers can be more easily handled and removed from the skids on the production line since covers are in convenient stacks. Pallets need to be changed less often because of the higher packing density. Less scratching of the covers occurs, FIG. 7, because the conical tapered segments 22' above the stops 20' prevent the inside of one cover 10 from coming into contact with the outside of the adjacent cover 10'. The wall thickness of the flange was reduced, making the ID of the cover flange larger. This larger ID allows the cover flange to fit over all the competitive meter bases making it interchangeable with them. Presently, the existing covers are not interchangeable with all competitive meter bases. The wall section thicknesses were reduced throughout the cover from its face, sidewalls and flange and these thinner wall sections reduced both the overall cover weight and the mold cycle time.

While there has been described a preferred embodiment of the invention, it will be understood that further modifications may be made without departing from the spirit and scope of the invention as set forth in the appended claims.

What is claimed is:

1. A stackable plastic cover for use on electrical meters constructed to allow a series of covers to be stacked into a column comprising a tapered conical sidewall having a central axis, a closed circular top and an open circular bottom, an annular flange projecting outwardly from said conical sidewall adjacent said open circular bottom, a plurality of stop members projecting outwardly from and arranged around the periphery of said tapered conical sidewall at a predetermined distance above said annular flange, a plurality of tapered ribs corresponding to said plurality of stop members aligned with said stop members and extending there above along the surface and axially of the tapered conical sidewall, whereby said stop members provide a stop for the annular flange of an adjacent cover in the column to rest upon and spaced from the first-named annular flange a distance determined by said predetermined distance, and whereby said ribs guide the adjacent cover into engagement with said stop members so as to prevent scratching of said sidewalls of said covers.

2. A stackable plastic cover according to claim 1 wherein each of said plurality of stop members has the configuration of a longitudinal segment of an inverted conical shaped projection, said inverted conical shaped projection having a flat base portion projecting outwardly from the periphery of said tapered conical sidewall and substantially perpendicular to the central axis of said conical sidewall.

3. A stackable plastic cover according to claim 2 wherein each of said plurality of tapered ribs has a configuration of a longitudinal segment of a conical projection and smaller than said inverted conical projection.

4. A stackable plastic cover according to claim 1 molded from a clear high strength polycarbonate material.

* * * * *